(12) United States Patent
Kim et al.

(10) Patent No.: US 9,419,060 B2
(45) Date of Patent: Aug. 16, 2016

(54) DISPLAY DEVICE

(71) Applicant: LG DISPLAY CO., LTD., Seoul (KR)

(72) Inventors: Min Seok Kim, Seoul (KR); Hyun Jin An, Paju-si (KR); Go Eun Jung, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/308,303

(22) Filed: Jun. 18, 2014

(65) Prior Publication Data

US 2014/0374716 A1  Dec. 25, 2014

(30) Foreign Application Priority Data

Jun. 21, 2013  (KR) .................. 10-2013-0071526

(51) Int. Cl.
  *H01L 29/08*  (2006.01)
  *H01L 27/32*  (2006.01)
  *H01L 51/52*  (2006.01)

(52) U.S. Cl.
  CPC .......... *H01L 27/3232* (2013.01); *H01L 27/326* (2013.01); *H01L 51/524* (2013.01)

(58) Field of Classification Search
  CPC ............... H01L 23/5225; H01L 27/14623; H01L 27/14818; H01L 27/3272; H01L 2929/78633; H01L 31/02162; H01L 31/02164
  See application file for complete search history.

(56) References Cited

U.S. PATENT DOCUMENTS

| | | | |
|---|---|---|---|
| 2007/0007870 A1* | 1/2007 | Yamazaki | H01L 51/0025 313/112 |
| 2007/0057932 A1* | 3/2007 | Shin | H01L 27/3232 345/204 |
| 2007/0132713 A1* | 6/2007 | Seo | G02F 1/167 345/107 |
| 2012/0242565 A1* | 9/2012 | Noh | G02F 1/167 345/107 |
| 2014/0048829 A1* | 2/2014 | Shin | G02F 1/136209 257/91 |

* cited by examiner

Primary Examiner — Steven Loke
Assistant Examiner — Samuel Park
(74) Attorney, Agent, or Firm — Dentons US LLP

(57) ABSTRACT

Provided is a display device including first and second substrates having an emission region and a transparent region and disposed to face each other, a light emission layer formed on the emission region of the first substrate, a barrier formed to cover the light emission layer and a variable light shield layer formed in the barrier within the transparent region of the first substrate.

18 Claims, 3 Drawing Sheets

DISPLAY DEVICE

CROSS-REFERENCE TO RELATED APPLICATION

The present application claims priority under 35 U.S.C. §119(a) of Korean Patent Application No. 10-2013-0071526 filed on Jun. 21, 2013, the contents of which are incorporated by reference for all purposes as if set forth herein.

BACKGROUND OF THE INVENTION

1. Field of the Invention

The present application relates to a display device. More particularly, the present application relates to a transparent display device adapted to enhance display efficiency.

2. Background of the Related Art

In general, liquid crystal display (LCD) devices, plasma display panels (PDPs) and organic light emitting display (OLED) device have features of thinness, light weight, low power consumption and low driving voltage compared to cathode ray tube (CRT) displays. As such, the LCD devices, the PDPs and the OLED display devices are being applied to a variety of appliances.

Recently, transparent display devices are intensively being developed as next generation display devices. The transparent display device not only performs a general display function but also selectively displays rear scenes by transmitting light.

A transparent OLED (organic light emitting display) device among the transparent display devices cannot realize black. To address this matter, the transparent OLED device employs a variable light shield plate which is attached to the rear surface of an OLED panel. However, misalignment and moire problems can be generated because the variable light shield plate must be attached to the OLED panel. Moreover, the transparent OLED device must be thicker.

SUMMARY OF THE INVENTION

Accordingly, the present invention is directed to a display device that substantially obviates one or more of problems due to the limitations and disadvantages of the related art.

An advantage of the present invention is to provide a display device which is adapted to solve misalignment, moire and thickness increment problems which can be caused due to the attachment of the variable light shield plate.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

To achieve these and other advantages and in accordance with the purpose of this specification, as embodied and broadly described herein, there is provided a display device including: first and second substrates including an emission region and a transparent region and disposed to face each other; a light emission layer formed on the emission region of the first substrate; a barrier formed to cover the light emission layer; and a variable light shield layer formed in the barrier within the transparent region of the first substrate.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE ILLUSTRATED EMBODIMENTS

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
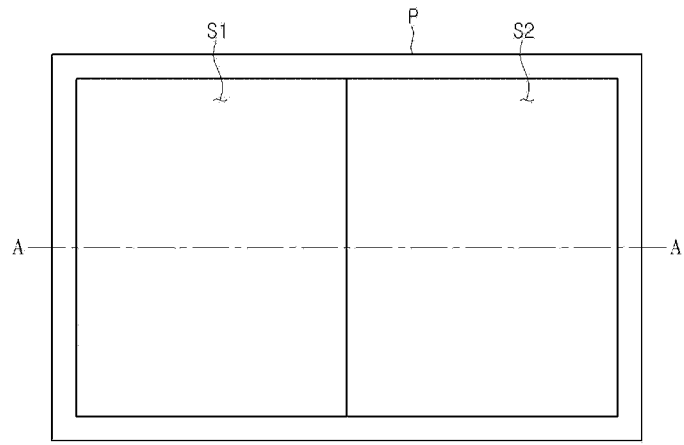
FIG. 1 is a planar view showing a display device according to a first embodiment of the present disclosure.
Figure 2:
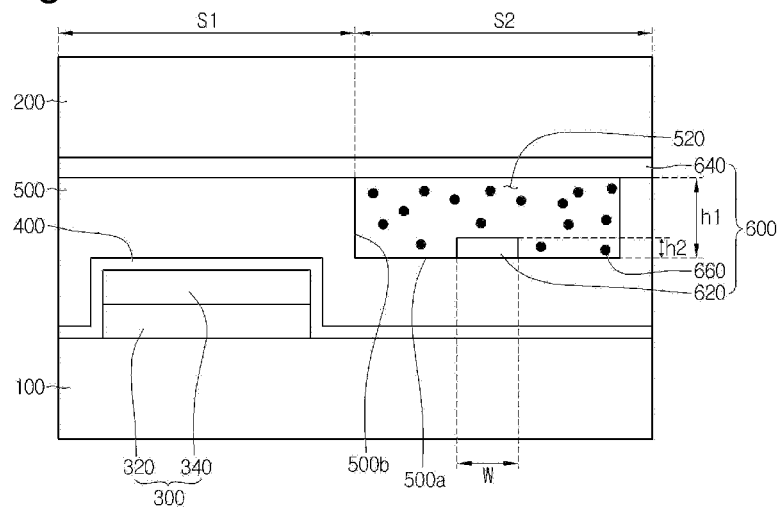
FIG. 2 is a cross-sectional view showing a sectional structure of the display device taken a line A-A' in FIG. 1.
Figure 3:
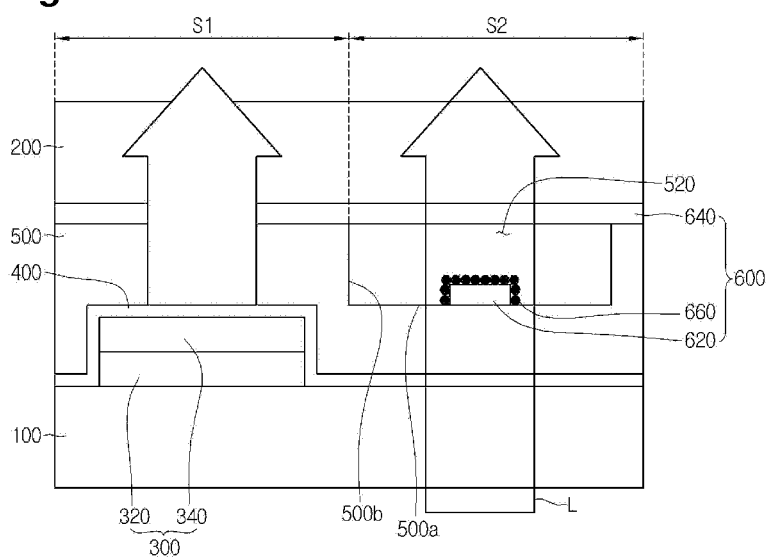
FIGS. 3 and 4 are cross-sectional views illustrating operation of a display device according to a first embodiment of the present disclosure.
Figure 4:
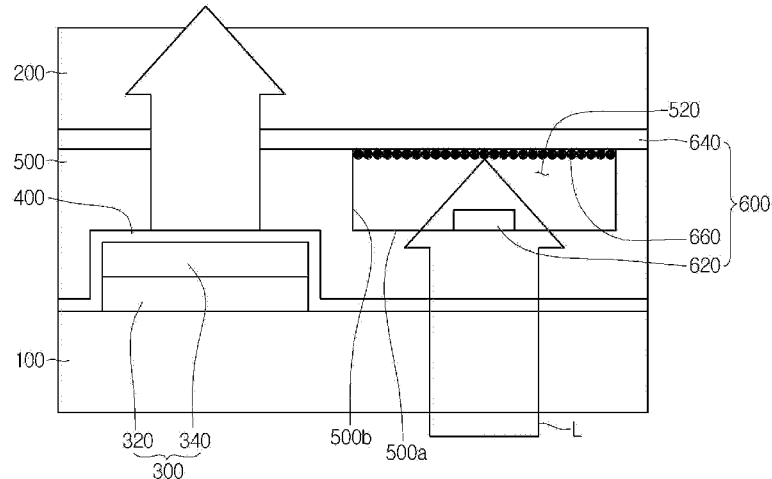

FIG. 1 is a planar view showing a display device according to a first embodiment of the present disclosure. FIG. 2 is a cross-sectional view showing a sectional structure of the display device taken a line A-A' in FIG. 1. FIGS. 3 and 4 are cross-sectional views illustrating operation of a display device according to a first embodiment of the present disclosure.

Referring to FIGS. 1 and 2, a display device according to a first embodiment of the present disclosure includes a plurality of sub-pixels P arranged adjacently to one another. Each of the sub-pixels P includes an emission region S1 and a transparent region S2. A light emission layer 300 is formed within the emission region S1 of the sub-pixel P. A variable light shield layer 600 can be formed within the transparent region S2.

The display device includes first and second substrates 100 and 200 disposed to face each other, the light emission layer 300 formed within the emission region S1 of the first substrate 100. Also, the display device includes a barrier 500 formed on the first substrate 100 in such a manner as to cover the light emission layer 300, and the variable light shield layer 600 can be formed in the barrier 500 in the region corresponding to the transparent region S2 of the first substrate 100.

The first substrate 100 can be formed from a transparent material. For example, the first substrate 100 can be one of a glass substrate and a plastic film. Also, the first substrate 100 can be either a rigid substrate or a flexible substrate. Moreover, the first substrate 100 can be formed in one of a tetragonal shape and a circle shape. Furthermore, the first substrate 100 can be divided into the emission region S1 and the transparent region S2.

The second substrate 200 can be disposed opposite to first substrate 100. The second substrate 200 can be formed from the same material as the first substrate 100. For example, the second substrate 200 can be one of a glass substrate and a plastic film, like the first substrate 100. Also, the second substrate 200 can be either a rigid substrate or a flexible substrate. Moreover, the second substrate 200 can be formed in one of a tetragonal shape and spherical shape.

Alternatively, the second substrate 200 can be a color filter substrate. In this case, color filters (not shown) can be formed on the lower surface of the second substrate 200.

The light emission layer 300 can be formed on the first substrate 100. In detail, the light emission layer 300 can be formed within the emission region S1 of the first substrate 100. Such a light emission layer 300 can include a thin film transistor (TFT) layer 320 and an organic light emission layer 340.

The TFT layer 320 can include scan signal lines (not shown), image data signal lines (not shown), switching element such as thin film transistors (not shown), and pixel electrodes (not shown) formed on sub-pixels P.

The switching element (not shown) is disposed at an intersection of the scan signal line and the image data signal line, and connected to the pixel electrode. Such pixel electrodes can be independently controlled by the switching elements (not shown).

The organic light emission layer 340 can be formed on the TFT layer 320. Alternatively, the organic light emission layer can be formed in the same plane as the TFT layer. Such an organic light emission layer 340 can include an injection layer (not shown), a transport layer (not shown) and an emission layer (not shown).

A sealing layer 400 can further be formed on the organic light emission layer. In detail, the sealing layer 400 can be formed on the entire surface of the first substrate 100 which includes the emission region S1 and the transparent region S2. In other words, the sealing layer 400 can be formed to cover the organic light emission layer 340. Also, the sealing layer can be formed from a transparent material. Moreover, the sealing layer 400 can be formed on the first substrate 100 through a deposition process.

The barrier 500 can be formed on the sealing layer 400. The barrier 500 can be formed on the entire surface of the first substrate 100 which includes the emission region S1 and the transparent region S2. Alternatively, the barrier can be formed only over the organic light emission layer.

A concave region S20 can be formed in an upper surface of the barrier 500 within the transparent region S2 of the first substrate 100. As such, concave region S20 of the barrier 500 formed in the transparent region S2 of the first substrate 100 can include a bottom surface 500a and side surfaces 500b. The bottom and side surfaces 500a and 500b can be formed perpendicularly to each other. Alternatively, the bottom and side surfaces can be formed to have a fixed inclination.

The depth (or height) h1 of the concave region S20 formed in the barrier 500 within the transparent region S2 of the substrate 100 can be in a range of about 10 μm~50 μm.

The variable light shield layer 600 can be formed within the transparent region S2 of the first substrate 100. Also, the variable light shield layer 600 can be disposed between the first substrate 100 and the second substrate 200. In detail, the variable light shield layer 600 can be formed in the barrier 500 within the transparent region S2 of the first substrate 100. In other words, the variable light shield layer 600 can be formed in the concave region 520 which is formed within the transparent region S2 of the first substrate 100.

The variable light shield layer 600 can include a first electrode 620, a second electrode 640 disposed to face the first electrode 620, and electrophoretic particles 660 injected between the first electrode 620 and the second electrode 640.

The first electrode 620 can be formed from a transparent material such as indium-tin-oxide (ITO). Alternatively, the first electrode 620 can be formed from an opaque material. The first electrode 620 can be formed on the bottom surface 520a of the barrier 500 which is formed in the transparent region S2 of the first substrate 100. Also, the first electrode 620 can be formed in a long bar shape which extends along the bottom surface 520a. Moreover, the first electrode 620 can be formed in a sectional structure of a tetragonal shape. Alternatively, the first electrode 620 can be formed in one of sectional structures such as a half-circle shape, a polygonal shape or others. Furthermore, the first electrode 620 can be formed in a width range of about 4 μm~10 μm. Preferably, the first electrode 620 is formed with a width of about 7 μm. Such a first electrode 620 can be formed in a thickness (or height) in the range of about 2000 Å through 3000 Å.

The second electrode 640 can be disposed opposite to the first electrode 620. Also, the second electrode 640 can be formed in the transparent region S2 of the first substrate 100. In detail, the second electrode 640 can be formed over the concave region S20 in the barrier 500 which is formed within the transparent region S20 of the first substrate 100.

Also, the second electrode 640 can be formed in such a manner as to extend up to the emission region S1 of the first substrate 100. In other words, the second electrode 640 can be formed in the entire area of the first substrate 100. In detail, the second electrode 640 can be formed to cover the concave region S20 of the barrier 500 which is formed within the transparent region S2 of the first substrate 100. As such, a fixed space can be formed between the first electrode 620 and the second electrode 640.

Moreover, the second electrode 640 can be formed from a transparent material. For example, the second electrode 640 can be formed from indium-tin-oxide (ITO). The second electrode 640 can be formed from the same material as the first electrode 620. Alternatively, the second electrode 640 can be formed from a material different from the first electrode 620.

The electrophoretic particles 660 can be injected between the first electrode 620 and the second electrode 640. The electrophoretic particles 660 can be formed from one of a resin-based material and an inorganic-based material and in the size of a nanometer. Also, the electrophoretic particles 660 can include a colorant. Moreover, the electrophoretic particles 660 can include a carbon nanotube. Such electrophoretic particles 660 can be injected between the first electrode 620 and the second electrode 640 through one of a capillary injection process and a vacuum injection process.

As shown in FIG. 3, when the display device is driven in a transmitting mode in which an electric field is applied between the first and second electrodes 620 and 640, the electrophoretic particles 660 are attached to the first electrode 620. In accordance therewith, light applied from an underside of the first substrate 100 can pass through the second substrate 200 via the variable light shield layer 600.

If the display device is driven in a light shield mode which another electric field is applied to the first and second electrodes 620 and 640, the electrophoretic particles 660 are attached to the second electrode 640 as shown in FIG. 4. As such, light applied from the underside of the first substrate 100 is shielded without passing through the variable light shield layer 600.

Such a variable light shield layer disclosed in an embodiment of the present disclosure can perform a light shielding function in the inner side of a cell (i.e., a pixel). Also, the variable light shield layer can be formed within the cell (i.e., pixel) using a barrier. As such, material costs, fabricating costs and panel thickness can be reduced, and a moire phenomenon can be prevented. Moreover, the variable light shield layer disclosed in an embodiment of the present disclosure is disposed beside the light emission layer. Therefore, transmittance can be enhanced as the size of the light emission layer decreases.

Figure 5:
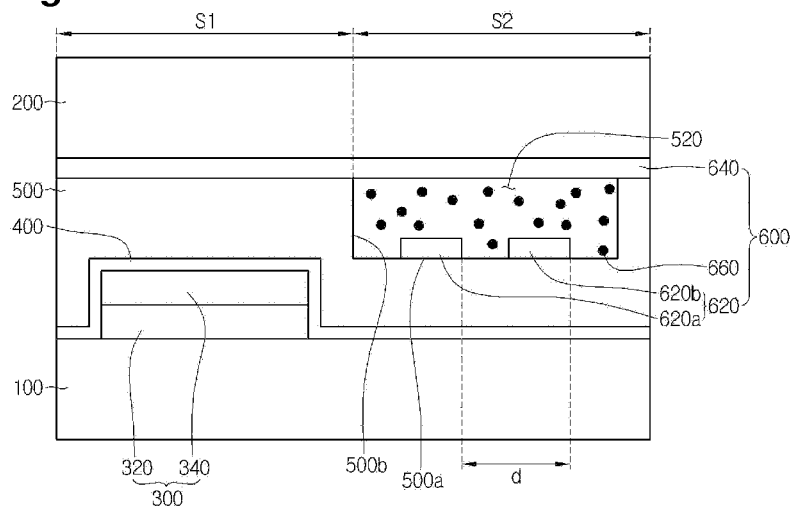
FIG. 5 is a cross-sectional view showing a display device according to a second embodiment of the present disclosure.
Figure 6:
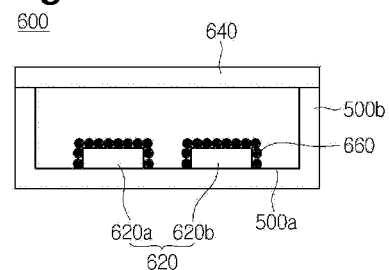
FIG. 6 is a cross-sectional view illustrating operation of a display device according to a second embodiment of the present disclosure.

FIG. 5 is a cross-sectional view showing a display device according to a second embodiment of the present disclosure. FIG. 6 is a cross-sectional view illustrating operation of a display device according to a second embodiment of the present disclosure.

Referring to FIG. 5, a display device according to a second embodiment of the present disclosure includes: first and second substrates 100 and 200 disposed to face each other; a light emission layer 300 formed within an emission region S1 of the first substrate 100; a sealing layer 400 formed on the first substrate 100 in such a manner as to cover the light emission layer 300; a barrier 500 formed on the sealing layer 400; and a variable light shield layer 600 formed in the barrier 500 within a transparent region S2 of the first substrate 100. The display device of the second embodiment has the same configuration as that of the first embodiment with exception of the variable light shield layer 600. As such, the description of the second embodiment overlapping with the first embodiment will be omitted.

The variable light shield layer 600 can be disposed between the first substrate 100 and the second substrate 200. In detail, the variable light shield layer 600 can be formed within the transparent region S2 of the first substrate 100. In other words, the variable light shield layer 600 can be formed in a concave region 520 in the barrier 500 which is formed within the transparent region S2 of the first substrate 100.

The variable light shield layer 600 can include a first electrode 620, a second electrode 640 disposed to face the first electrode 620, and electrophoretic particles 660 injected between the first electrode 620 and the second electrode 640.

The first electrode 620 can be formed from a transparent material such as indium-tin-oxide (ITO). Alternatively, the first electrode 620 can be formed from an opaque material. The first electrode 620 can be formed on the bottom surface 520a of the concave region of the barrier 500 which is formed within the transparent region S2 of the first substrate 100. Also, the first electrode 620 can be formed in a long bar shape which extends along the bottom surface 520a. Moreover, the first electrode 620 can be formed in a sectional structure of a tetragonal shape. Alternatively, the first electrode 620 can be formed in one of sectional structures such as a half-circle shape, a polygonal shape or others. Furthermore, the first electrode 620 can be formed with a width in the range of about 4 μm~10 μm. Preferably, the first electrode 620 is formed with a width of about 7 μm. Such a first electrode 620 can be formed with a thickness (or height) in the range of about 2000 Å through 3000 Å.

Alternatively, a plurality of first electrodes 620a and 620b can be formed on the bottom surface 500a of the concave region of the barrier 500. The plurality of first electrodes 620a and 620b can be separated from one another by a fixed distance. The distance between the first electrodes 620a and 620b adjacent to each other can be a range of about 40 μm~50 μm. Also, at least three first electrodes can be formed.

The second electrode 640 can be disposed opposite to the first electrode 620. Also, the second electrode 640 can be formed in the transparent region S2 of the first substrate 100. In detail, the second electrode 640 can be formed over the concave region S20 of the barrier 500 which is formed within the transparent region S2 of the first substrate 100. Moreover, the second electrode 640 can be formed in such a manner as to extend up to the emission region S1 of the first substrate 100. In other words, the second electrode 640 can be formed in the entire area of the first substrate 100. In detail, the second electrode 640 can be formed to cover the concave region S20 of the barrier 500 which is formed within the transparent region S2 of the first substrate 100. As such, a fixed space can be formed between the first electrode 620 and the second electrode 640.

Such a second electrode 640 can be formed from a transparent material. For example, the second electrode 640 can be formed from indium-tin-oxide (ITO). In other words, the second electrode 640 can be formed from the same material as the first electrode 620. Alternatively, the second electrode 640 can be formed from a material different from the first electrode 620.

The electrophoretic particles 660 can be injected between the first electrode 620 and the second electrode 640. The electrophoretic particles 660 can be formed from one of a resin-based material and an inorganic-based material and in the size of a nanometer. Also, the electrophoretic particles 660 can include a colorant. Moreover, the electrophoretic particles 660 can include a carbon nanotube. Such electrophoretic particles 660 can be injected between the first electrode 620 and the second electrode 640 through one of a capillary injection process and a vacuum injection process.

If the display device is driven in a transmitting mode which an electric field is applied between the plurality of first electrodes 620a and 620b and the second electrode 640, the electrophoretic particles 660 are attached to the first electrodes 620a and 620b as shown in FIG. 6. In accordance therewith, light applied from an underside of the first substrate 100 can pass through the second substrate 200 via the variable light shield layer 600.

Figure 7:
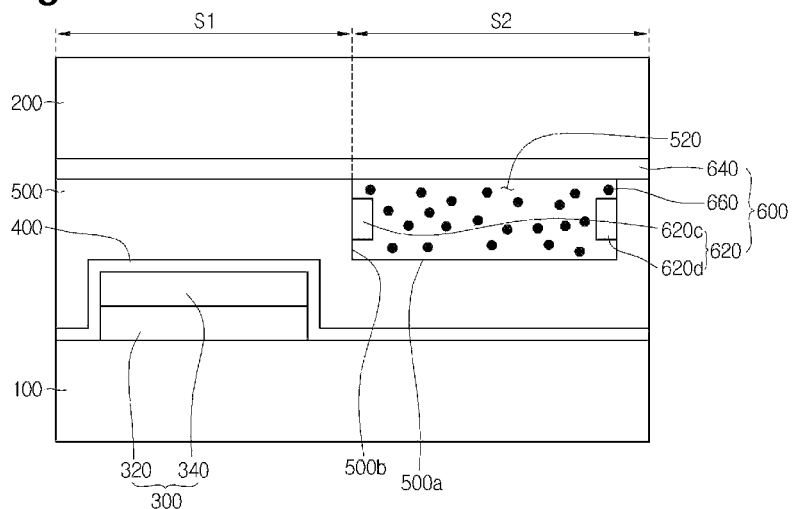
FIG. 7 is a cross-sectional view showing a display device according to a third embodiment of the present disclosure.
Figure 8:
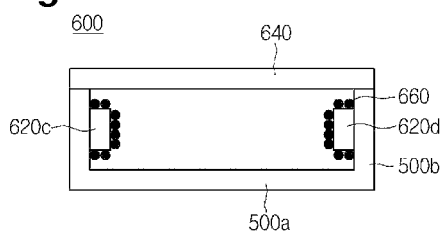
FIG. 8 is a cross-sectional view illustrating operation of a display device according to a third embodiment of the present disclosure.

FIG. 7 is a cross-sectional view showing a display device according to a third embodiment of the present disclosure. FIG. 8 is a cross-sectional view illustrating operation of a display device according to a third embodiment of the present disclosure.

Referring to FIG. 7, a display device according to a third embodiment of the present disclosure includes: first and second substrates 100 and 200 disposed to face each other; a light emission layer 300 formed within an emission region S1 of the first substrate 100; a sealing layer 400 formed on the first substrate 100 in such a manner as to cover the light emission layer 300; a barrier 500 formed on the sealing layer 400; and a variable light shield layer 600 formed in the barrier 500 within a transparent region S2 of the first substrate 100. The display device of the third embodiment has the same configuration as that of the first embodiment with exception of the variable light shield layer 600. As such, the description of the third embodiment overlapping with the first embodiment will be omitted.

The variable light shield layer 600 can be disposed between the first substrate 100 and the second substrate 200. In detail, the variable light shield layer 600 can be formed within the transparent region S2 of the first substrate 100. In other words, the variable light shield layer 600 can be formed in a concave region 520 of the barrier 500 which is formed within the transparent region S2 of the first substrate 100.

The variable light shield layer 600 can include a first electrode 620, a second electrode 640 disposed to face the first electrode 620, and electrophoretic particles 660 injected between the first electrode 620 and the second electrode 640.

The first electrode 620 can be formed from a transparent material such as indium-tin-oxide (ITO). Alternatively, the first electrode 620 can be formed from an opaque material. The first electrode 620 can be formed on the side surface 500b of the concave region of the barrier 500 which is formed in the transparent region S2 of the first substrate 100. Also, the first electrode 620 can be formed in a long bar shape which extends along the bottom surface 520a. Moreover, the first electrode 620 can be formed in a sectional structure of a tetragonal shape. Alternatively, the first electrode 620 can be formed in one of sectional structures such as a half-circle shape, a polygonal shape or others. Moreover, the first electrode 620 can be formed with a width in the range of about 4 μm~10 μm. Preferably, the first electrode 620 is formed with a width of about 7 μm. Furthermore, first electrode 620 can be formed with a thickness (or height) in the range of about 2000 Å through 3000 Å.

Such a first electrode 620 can be disposed on one of side surfaces 500b of the concave region of the barrier 500. The first electrode 620 can include two electrodes 620c and 620d which are disposed on both side surfaces 500b of the concave region of the barrier 500 opposite to each other. Alternatively, the first electrode 620c or 620d can be disposed only on one of the side surfaces 500b of the barrier 500 opposite to each other.

The second electrode 640 can be formed in the transparent region S2 of the first substrate 100. In other words, the second electrode 640 can be formed over the concave region S20 of the barrier 500 which is formed within the transparent region S2 of the first substrate 100.

Also, the second electrode 640 can be formed in such a manner as to extend up to the emission region S1 of the first substrate 100. In other words, the second electrode 640 can be formed in the entire area of the first substrate 100. In detail, the second electrode 640 can be formed to cover the concave region S20 of the barrier 500 which is formed within the transparent region S2 of the first substrate 100. As such, a fixed space can be formed between the first electrode 620 and the second electrode 640.

Moreover, the second electrode 640 can be formed from a transparent material. For example, the second electrode 640 can be formed from indium-tin-oxide (ITO). The second electrode 640 can be formed from the same material as the first electrode 620. Alternatively, the second electrode 640 can be formed from a material different from the first electrode 620.

The electrophoretic particles 660 can be injected between the first electrode 620 and the second electrode 640. The electrophoretic particle 660 can be formed from one of a resin-based material and an inorganic-based material and in the size of a nanometer. Also, the electrophoretic particles 660 can include a colorant. Moreover, the electrophoretic particles 660 can include a carbon nanotube. Such electrophoretic particles 660 can be injected between the first electrode 620 and the second electrode 640 through one of a capillary injection process and a vacuum injection process.

When the display device is driven in a transmitting mode in which an electric field is applied between a pair of the first electrodes 620c and 620d and the second electrode 640, the electrophoretic particles 660 are attached to the first electrodes 620c and 620d. In accordance therewith, light applied from an underside of the first substrate 100 can pass through the second substrate 200 via the variable light shield layer 600.

As described above, the display device according to an embodiment of the present disclosure allows the variable light shield layer to be formed in the inner side of a cell (i.e., pixel). As such, material costs, fabricating costs and panel thickness can be reduced, and a moire phenomenon can be prevented.

Moreover, the display device according to an embodiment of the present disclosure allows the variable light shield layer to be disposed by the side of the light emission layer. Therefore, transmittance can be enhanced as the size of the light emission layer decreases.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. A display device comprising:
a first substrate and a second substrate located above the first substrate and including an emission region and a transparent region adjacent each other between the first and the second substrates and defining a sub-pixel;
a light emission layer within the emission region of the first substrate, the light emission layer including a thin-film transistor layer and an organic emission layer;
a sealing layer on the thin-film transistor layer and the organic emission layer;
a barrier layer on the sealing layer in the emission region and the transparent region; and
a variable light shield layer in the barrier layer within the transparent region,
wherein the variable light shield layer is in a concave region in an upper surface of the barrier layer, and
wherein the concave region includes a bottom surface and side surfaces,
wherein the variable light shield layer further includes:
a first electrode at a first side surface of the variable light shield layer;
a second electrode covering an entire upper surface of the first substrate; a third electrode at a second side surface of the variable light shield layer opposite the first side surface of the variable light shield layer; and
a plurality of electrophoretic particles adjacent the first electrode, the second electrode, and the third electrode.

2. The display device of claim 1, wherein the concave region has a depth of 10 μm~50 μm.

3. The display device of claim 1, wherein the first electrode has a width of 4 μm~10 μm.

4. The display device of claim 3, wherein the first electrode has a width of 7 μm.

5. The display device of claim 1, wherein the first electrode has a thickness of 2000 Å to 3000 Å.

6. The display device of claim 1, wherein the second electrode covers the concave region.

7. The display device of claim 6, wherein the second electrode covers an entire upper surface of the barrier layer in the emission region.

8. The display device of claim 1, wherein the organic emission layer is on the thin film transistor layer.

9. The display device of claim 1, wherein the sealing layer extends to the transparent region which is formed on the first substrate.

10. The display device of claim 1, wherein the second substrate is a color filter substrate including a color filter layer.

11. The display device of claim 1, wherein the variable light shield layer is electrically driven to block or transmit light.

12. The display device of claim 11, wherein the variable light shield layer is electrically driven by an electric field applied to the first electrode the second electrode and the third electrode.

13. A display device comprising:
- a first substrate and a second substrate located above the first substrate;
- an emission region and a transparent region adjacent to each other between the first and the second substrates defining a sub-pixel;
- a light emission layer within the emission region which is formed on the first substrate, the light emission layer including a thin-film transistor layer and an organic emission layer;
- a sealing layer on the thin-film transistor layer and the organic emission layer; and
- a variable light shield layer on the sealing layer within the transparent region,
- wherein the variable light shield layer is in a concave region in an upper surface of a barrier layer on the sealing layer, and
- wherein the concave region includes a bottom surface and side surfaces,
- wherein the variable light shield layer further includes:
  - a first electrode covering an entire upper surface of the first substrate;
  - a second electrode at a first side surface of the variable light shield layer; a third electrode at a second side surface of the variable light shield layer opposite the first side surface of the variable light shield layer; and
  - a plurality of electrophoretic particles adjacent to the first electrode, the second electrode, and the third electrode.

14. The display device of claim 13, wherein the sealing layer extends to the transparent region which is formed on the first substrate.

15. A method of fabricating a display device comprising:
providing a first substrate and a second substrate;
forming a light emission layer within an emission region on the first substrate, the light emission layer including a thin-film transistor layer and an organic emission layer;
forming a sealing layer on the light emission layer;
forming a barrier layer on the sealing layer; and
forming a variable light shield layer in the barrier layer within a transparent region on the first substrate,
wherein the transparent region is adjacent the emission region between the first and the second substrates, and
wherein the variable light shield layer includes a first electrode covering an entire upper surface of the first substrate, a second electrode formed at a first side surface of the variable light shield layer, and a third electrode formed at a second side surface of the variable light shield layer opposite the first side surface of the variable light shield layer.

16. The method of claim 15, wherein the sealing layer is formed on an entire surface of the first substrate.

17. The method of claim 15, wherein the barrier layer is formed on an entire surface of the sealing layer.

18. The method of claim 15, wherein the variable light shield layer is formed in a concave region of the barrier layer.

* * * * *